(12) United States Patent
Tao et al.

(10) Patent No.: US 12,538,779 B2
(45) Date of Patent: Jan. 27, 2026

(54) METHOD FOR PRODUCING A BURIED INTERCONNECT RAIL OF AN INTEGRATED CIRCUIT CHIP

(71) Applicant: IMEC VZW, Leuven (BE)

(72) Inventors: Zheng Tao, Heverlee (BE); Waikin Li, Leuven (BE)

(73) Assignee: IMEC VZW, Leuven (BE)

( * ) Notice: Subject to any disclaimer, the term of this patent is extended or adjusted under 35 U.S.C. 154(b) by 613 days.

(21) Appl. No.: 17/884,870

(22) Filed: Aug. 10, 2022

(65) Prior Publication Data

US 2023/0046117 A1 Feb. 16, 2023

(30) Foreign Application Priority Data

Aug. 11, 2021 (EP) .................................. 21190833

(51) Int. Cl.
*H01L 21/306* (2006.01)
*H01L 21/762* (2006.01)
(Continued)

(52) U.S. Cl.
CPC ...... *H01L 23/481* (2013.01); *H01L 21/30604* (2013.01); *H01L 21/76224* (2013.01);
(Continued)

(58) Field of Classification Search
CPC ............... H01L 23/481; H01L 23/5283; H01L 21/30604; H01L 21/76224;
(Continued)

(56) References Cited

U.S. PATENT DOCUMENTS 10,872,818 B2   12/2020  Chiang et al.
2015/0371893 A1* 12/2015 Chou ................ H01L 21/743
                                                 257/621
(Continued)

FOREIGN PATENT DOCUMENTS

EP    3035369 A1   6/2016
EP    3324436 A1   5/2018

OTHER PUBLICATIONS

European Patent Office; Extended European Search Report and Written Opinion, Application No. EP21190833.0, mailed Feb. 10, 2022, 7 pages.

(Continued)

*Primary Examiner* — Jeff W Natalini
*Assistant Examiner* — Andrew Zabel
(74) *Attorney, Agent, or Firm* — McDonnell Boehnen Hulbert & Berghoff LLP (57) ABSTRACT

A method includes forming a trench in a semiconductor layer of a device wafer and depositing a liner on the trench sidewalls. The liner is removed from the trench bottom, and the trench is deepened anisotropically to form an extension fully along the trench, or locally by applying a mask. The semiconductor material is removed outwardly from the extension by etching to create a cavity wider than the trench and below the liner. A space formed by the trench and cavity is filled with electrically conductive material to form a buried interconnect rail comprising a narrow portion in the trench and a wider portion in the cavity. The wider portion can be contacted by a TSV connection, enabling a contact area between the connection and buried rail. The etching forms a wider rail portion at a location remote from active devices formed on the front surface of the semiconductor layer.

20 Claims, 8 Drawing Sheets

(51) Int. Cl.
  *H01L 21/768* (2006.01)
  *H01L 23/48* (2006.01)
  *H01L 23/528* (2006.01)
(52) U.S. Cl.
  CPC .......... *H01L 21/76831* (2013.01); *H01L 21/76877* (2013.01); *H01L 21/76898* (2013.01); *H01L 23/5283* (2013.01)
(58) Field of Classification Search
  CPC ......... H01L 21/76831; H01L 21/76877; H01L 21/76898
  See application file for complete search history.

(56) References Cited

U.S. PATENT DOCUMENTS

| | | | | |
|---|---|---|---|---|
| 2020/0135634 A1* | 4/2020 | Chiang | ................ | H10D 64/251 |
| 2020/0219813 A1* | 7/2020 | Paul | .................... | H10D 64/251 |
| 2020/0266169 A1 | 8/2020 | Kang et al. | | |
| 2020/0373331 A1 | 11/2020 | Kim et al. | | |
| 2020/0411436 A1 | 12/2020 | Xie et al. | | |
| 2021/0028112 A1 | 1/2021 | Kim et al. | | |
| 2021/0166975 A1* | 6/2021 | Gardner | ................ | H01L 21/743 |
| 2021/0217655 A1* | 7/2021 | Boyd | ................ | H01L 21/76286 |
| 2021/0305130 A1* | 9/2021 | Cho | ........................ | H10B 10/12 |
| 2021/0336004 A1* | 10/2021 | Huang | .............. | H10D 30/6757 |
| 2022/0148969 A1* | 5/2022 | Xie | ................... | H01L 23/53242 |
| 2023/0335491 A1* | 10/2023 | Tung | ................ | H01L 21/76224 |

OTHER PUBLICATIONS

Victor Moroz, Xi-Wei Lin, Plamen Asenov, Deepak Sherlekar, Munkang Choi, Binjie Cheng, Suketu Parikh, Po-Wen Chan, and J. J. Lee; "Can We Ever Get to a 100 nm Tall Library? Power Rail Design for 1nm Technology Node"; 2020 IEEE Symposium on VLSI Technology Digest of Technical Papers, pp. 1-2. IEEE, 2020.
Jiajun Shi, Mingyu Li, and Csaba Andras Moritz; "Power-delivery network in 3D ICs: Monolithic 3D vs. Skybridge 3D CMOS"; 2017 IEEE/ACM International Symposium on Nanoscale Architectures (NANOARCH), pp. 73-78. IEEE, 2017.
K Manohar et al.; "Buried Powered 4t Sram with Improved Write Margin"; International Journal of Innovative Technology and Exploring Engineering (IJITEE), vol. 9, Issue 3, Jan. 2020, pp. 2348-2351.

* cited by examiner

METHOD FOR PRODUCING A BURIED INTERCONNECT RAIL OF AN INTEGRATED CIRCUIT CHIP

CROSS-REFERENCE TO RELATED APPLICATIONS

The present application is a non-provisional patent application claiming priority to European Patent Application No. 21190833.0, filed Aug. 11, 2021, the contents of which are hereby incorporated by reference.

FIELD OF THE DISCLOSURE

The disclosure relates to integrated circuit chips, hereafter abbreviated to ICs or IC chips, in particular to the production of buried interconnect rails, primarily used for the delivery of power to active devices on the chip.

BACKGROUND

Semiconductor processing for the fabrication of integrated circuit chips continues to evolve towards increasing device-density: higher numbers of active devices (mainly transistors) of ever decreasing device dimensions are placed on a given surface of semiconductor material.

As conventional complementary metal oxide semiconductor (CMOS) scaling is reaching its physical limits and facing increasingly constraining design restrictions, new, alternative embodiments can help preserve the overall power-performance-area-cost (PPAC) logic roadmap and continue delivering profitable node-to-node scaling gains. Introduction of buried power rails (BPR) and a back-side power delivery network (PDN) have been proposed to address interconnect congestion issues by enabling further scaling with extra routing options.

The combined application of BPR and a back side PDN is described for example in patent publication document EP3324436A1. This document proposes to connect the buried power rails from the back side of the semiconductor layer onto which the active devices are formed. After thinning a device wafer to thereby expose the back side of the semiconductor layer, small Through Silicon Via connections (often called TSVs, nano-TSVs, nTSVs, or nTSV) are realized from the exposed backside, contacting the buried power rails.

The improvement of contact resistances in the path from the chip's back side to the front side is an ongoing concern in the development of IC chip designs. One issue is the high contact resistivity between nTSVs and the buried power rails because of the small contact surface area between the rails and the nTSVs. This problem is becoming more acute as the width of the buried rails is becoming smaller due to increasing device density on the chip. The width (also referred to as the critical dimension) of the nTSVs is now generally significantly larger than the width of the buried rails, leading to a very small contact area between the two, hence an increased resistivity of the contact area.

Patent publication document U.S. Ser. No. 10/872,818B2 discloses the formation of buried power rails which are self-aligned to the area between two semiconductor fins formed on a semiconductor substrate. The rails are furthermore connected to a buried contact with a larger cross-section than the buried rail itself. This is done by applying a combination of an anisotropic etch process and an isotropic etch process, the latter leading to the formation of a diamond shaped trench, that is subsequently filled with a conductive material, to form the buried contact. The rail is formed thereafter by filling the area between the two fins. Nano-TSVs are formed by etching from the back side, wherein the critical dimensions of the TSVs are smaller than the diamond-shaped contact. The function of the diamond-shaped contact is therefore primarily to solve alignment problems between the buried rail and the TSVs. Also, the isotropic etching used to produce the diamond-shaped trench is likely to approach the bottom of the fins, which may cause stress effects that negatively influence the functionality of active devices built on the fins.

SUMMARY

This disclosure discusses embodiments related to the problems highlighted above. For example, the disclosure describes a method for producing an IC chip. According to an embodiment in the form of a method, a trench is formed in a semiconductor layer of a device wafer for the fabrication of ICs, followed by the deposition of a liner on the sidewalls of the trench. The liner is removed from the bottom of the trench, and the trench can be deepened anisotropically to form an extension of the trench. This can be done along the full length of the trench, or locally by applying a mask such as a photomask or a hardmask for example formed of a stack of spin-on-carbon (SOC) and spin-on-glass (SOG). An etch process is then applied, creating a cavity that is wider than the trench. This can be done by an isotropic etch process or by atomic layer etching for example. The etch process is selective relative to the liner, so that the cavity is formed essentially below the liner when the semiconductor layer's front surface is facing upward. Then the combined space formed by the trench and the cavity is filled with an electrically conductive material, possibly after forming a second liner. This results in the formation of a buried interconnect rail comprising a narrow portion in the area of the trench and a wider portion in the area of the cavity. The wider portion can be contacted from the back side of the semiconductor layer by a TSV connection, enabling a large contact area between the TSV connection and the buried rail. The selectivity of the etch process applied for forming the cavity (selectivity with respect to the liner) results in the formation of the cavity and thereby of the wider rail portion at a location that is remote from the active devices formed on the front surface of the semiconductor layer. This can increase a contact area between the TSV and the buried rail without negatively influencing the functionality of the active devices on the front side of the semiconductor layer, e.g., on the front side of the eventual ICs produced from the device wafer.

The disclosure also relates to a method for producing a buried interconnect rail of an integrated circuit chip, the method includes providing a device wafer comprising a semiconductor layer on top. The semiconductor layer has a front surface and a back surface. The semiconductor layer can also include a dielectric layer on at least one or more parts of the front surface of the semiconductor layer. The method also includes producing a trench in the semiconductor layer or through the dielectric layer and into the semiconductor layer. The method further includes producing a dielectric liner on the inner surfaces of the trench. Additionally, the method includes removing the liner from the bottom of the trench or from one or more parts of the bottom of the trench, the parts being determined by producing a mask having one or more openings corresponding to the one or more parts, while maintaining the liner on the sidewalls of the trench. Furthermore, the method includes applying an etch process that is selective with respect to the liner or with respect to the liner and the mask, thereby creating at least one cavity extending downward and laterally outward from the bottom of the trench or from each of the one or more parts of the bottom of the trench. Furthermore still, the method includes filling the at least one cavity and the trench with an electrically conductive material to thereby form the buried interconnect rail. The buried interconnect rail comprises a narrow portion inside the trench and at least one wider portion inside the at least one cavity.

As a consequence of the etch selectivity, the at least one cavity is formed essentially below the liner or below the liner and the mask when the front surface of the semiconductor layer faces upwards.

The method can further comprise deepening the bottom of the trench or the one or more parts of the bottom of the trench while maintaining the liner on the sidewalls of the trench, thereby creating one or more extensions of the trench. No liner is present on the sidewalls of the one or more extensions. The etch process for forming the at least one cavity is applied after the formation of the one or more extensions. The formation of the extension takes place anisotropically with respect to the trench, or in other words, the sidewalls of the extensions are prolongations of the sidewalls of the trench, without extending laterally with respect to the trench. In the wording "at least one cavity extending downward and laterally outward from the bottom of the trench", and the "bottom of the trench" refer to the bottom of the trench before the creation of the extension, when such an extension is formed prior to the cavity formation.

According to an embodiment, the etch process is an isotropic etch process and the at least one cavity has a spherical shape, a circular shape, or a diamond shape, as seen in a cross section oriented perpendicularly with respect to the longitudinal direction of the trench.

According to another embodiment, the etch process is an atomic layer etch process and the at least one cavity has a rectangular shape, as seen in a cross section oriented perpendicularly with respect to the longitudinal direction of the trench.

The method can further comprise thinning the device wafer until the back surface of the semiconductor layer is exposed and producing a via opening through the back surface. The via opening is wider than the narrow portion of the buried rail and fully overlaps the narrow portion so that the via opening also overlaps at least part of the wider portion of the buried rail. The method can also include filling the via opening with an electrically conductive material, thereby forming a TSV connection that contacts one of the wider portions of the buried rail.

According to an embodiment, filling the trench and the at least one cavity results in the appearance of a void essentially in the center of the at least one wider portion of the rail. After forming the via opening, the wider portion of the rail is partially removed until a part of the inner surface of the void is exposed. The TSV connection is formed by filling the part of the inner surface of the void and by filling the via opening with the conductive material.

According to an embodiment, a second dielectric liner is deposited on the first liner and on the inner surface of the at least one cavity, before filling the cavity and the trench with the electrically conductive material.

According to an embodiment, the first liner is removed from the sidewalls of the trench, before filling the trench and the at least one cavity, possibly followed by depositing a second liner on the sidewalls of the trench and on the inner surface of the cavity.

The disclosure also relates to a microstructure comprising a semiconductor layer having a front surface and a back surface. The semiconductor layer comprises on its front surface a plurality of semiconductor devices. The microstructure further comprises: a plurality of interconnect rails buried at least partially in the semiconductor layer, and a plurality of TSV connections from the back surface of the semiconductor layer to the interconnect rails. The rails comprise a narrow portion at the side nearest to the front surface of the semiconductor layer and at least one wider portion at the side nearest to the back surface of the semiconductor layer. A dielectric liner is formed between the sidewalls of the narrow portion of the rails and the semiconductor layer. The at least one wider portion is located essentially below the liner, when the front surface of the semiconductor layer faces upwards. The TSV connections are wider than the narrow portion of the rails and fully overlap the narrow portions. The TSV connections are in physical contact with one or more of the wider portions of the buried rails.

At least some of the embodiments relate to an integrated circuit chip comprising a microstructure in accordance with described embodiments.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

I. Introduction

Example embodiments will now be described more fully hereinafter with reference to the accompanying drawings.

That which is encompassed by the claims can, however, be embodied in many different forms and should not be construed as limited to the embodiments set forth herein; rather, these embodiments are provided by way of example. Furthermore, like numbers refer to the same or similar elements or components throughout.

In the following detailed description, at least some of the example embodiments in the form of a method are described with respect to producing an integrated circuit chip comprising a CMOS layout of fin field-effect transistors (finFETs) arranged in standard cells on a semiconductor substrate and supplied with power from the back side of the chip through nTSVs and buried power rails. However, the example embodiments are not limited to these particulars. Instead of fin-based active devices, the active devices can be planar devices or nano-sheet based devices. The rails are not limited to power supply rails, but can be any other type of interconnect rail. Any reference to materials used for the various layers and areas that will be described is merely intended as an example of suitable materials, and is not to be understood as a limitation of the scope of the example embodiments.

II. Example Structure

Figure 1:
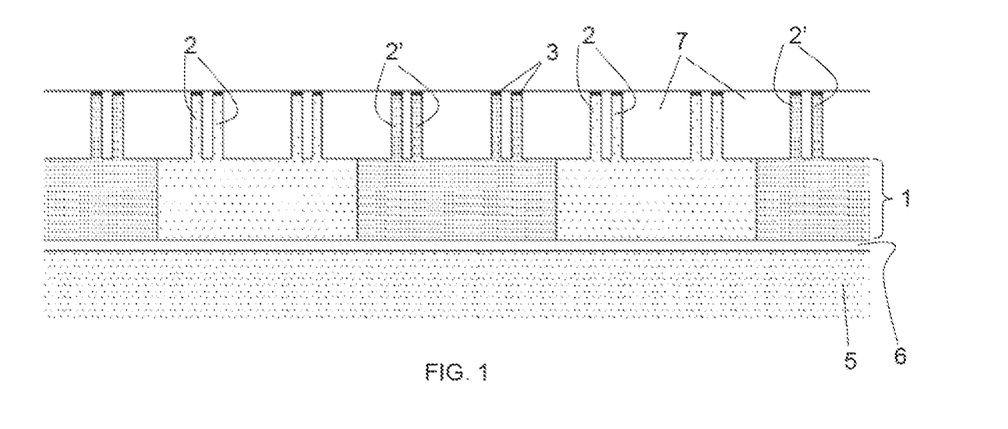
FIG. 1 shows a section view of a portion of a device wafer comprising p-type fins and n-type fins, and onto which one or more example embodiments can be applied.

FIG. 1 shows a small portion of a device wafer (e.g., a wafer onto which active devices of several IC chips are to be processed), comprising a monocrystalline silicon (Si) layer 1, into which a number of fins 2 and 2' have been produced by a known lithography and etch technique, applying etch masks 3. The width of the fins can be in the order of 10 nm or less. The two different types of hatching indicate different doping types (referred to also by respective references 2 and 2'), typically p-type and n-type doping. This layout is typically used for producing P-channel metal-oxide semiconductor (pMOS) and N-channel metal-oxide semiconductor (nMOS) transistors arranged in multiple standard cells. In this example, the layout comprises regularly spaced pairs of fins arranged in alternate groups of four p-type fins 2 and four n-type fins 2'.

The Si layer 1 is a monocrystalline top layer of a multilayer device wafer comprising a base wafer 5, typically a Si wafer, and a thin etch stop layer 6, which can be a silicon-germanium (SiGe) layer. The Si layer 1 (including the fins) can have a thickness less than 1 µm, for example about 500 nm. The etch stop layer 6 can be a SiGe layer of about 50 nm thick, for example. Its function as an etch stop layer is to stop the etching of the base wafer 5 from the back side, as will be explained later in this description. The SiGe layer 6 and the monocrystalline Si layer 1 can be produced on a Si base wafer 5 by techniques well known in the art, for example, by epitaxial growth methods. An alternative would be to use a silicon-on-insulator (SOI) wafer, wherein the insulator layer plays the part of etch stop layer later in the process. The fins 2, 2' are embedded in a layer 7 of dielectric material. Typically this is a layer of silicon oxide ($SiO_2$), also referred to as "shallow trench isolation" (STI) oxide. We will hereafter refer to this layer as the STI layer 7. The STI layer 7 is planarized to the level of the etch masks 3, by a planarization technique known as such in the art, including for example one or more CMP (chemical mechanical polishing) steps.

Figure 2A:
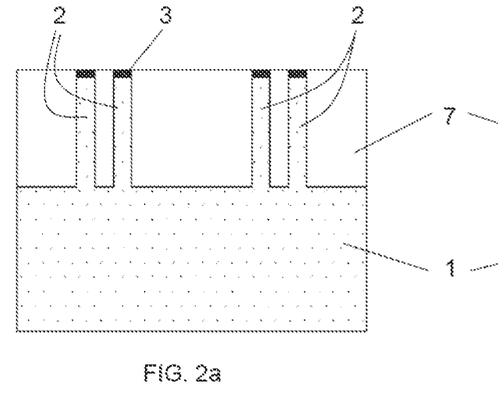
FIG. 2*a*, FIG. 2*b*, FIG. 2*c*, FIG. 2*d*, FIG. 2*e*, FIG. 2*f*, FIG. 2*g*, FIG. 2*h*, FIG. 2*i*, FIG. 2*j*, FIG. 2*k*, FIG. 2*l*, FIG. 2*m*, and FIG. 2*n* illustrate functions corresponding to a method in accordance with the example embodiments.

FIG. 2a is an enlarged image of one p-type area of the Si layer 1, including two pairs of p-type fins 2. Aspects pertaining to a method for producing a buried power rail in the area between these two pairs of fins will now be described in more detail. It is to be understood that the functions described hereafter are performed simultaneously between all pairs of p-type fins 2 and between all pairs of n-type fins 2' across a given area of the device wafer.

Figure 2B:
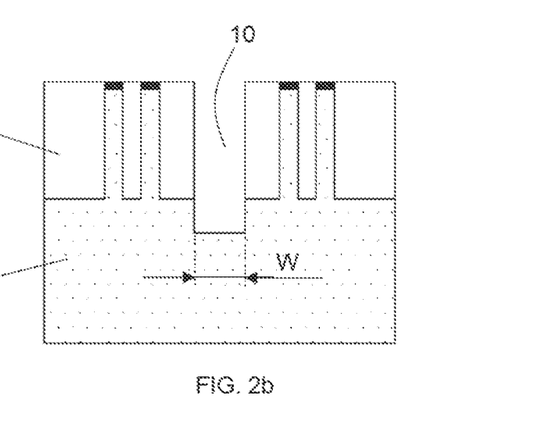

As shown in FIG. 2b, a trench 10 having essentially parallel sidewalls is formed in the device wafer, extending through the STI layer 7 and into the bulk of the Si layer 1. This can be done by lithography and etching, using an etch recipe or a combination of different recipes suitable for obtaining this shape of the trench 10 through the STI material 7 and the silicon 1. Suitable lithography processes and etch recipes of this type are well known in the art and therefore not described here in detail. The trench 10 can, for example, have a width W of about 20 nm. The length of the trench in the direction perpendicular to the drawing is chosen in accordance with a particular layout of active devices that are to be processed on the fins.

Figure 2C:
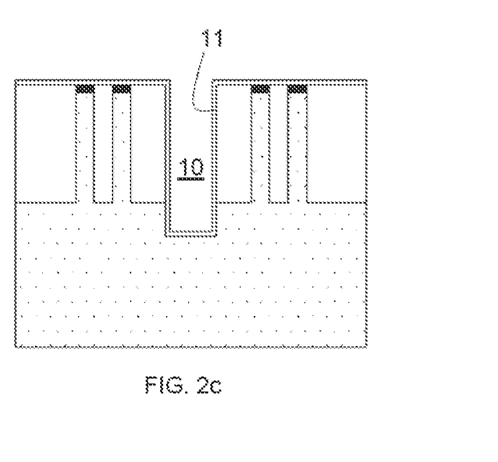

As illustrated in FIG. 2c, a dielectric liner 11 is then deposited on the bottom and sidewalls of the trench and on the upper surface of the device wafer (e.g., on the planarized surface of the STI dielectric 7 and the etch masks 3). The liner 11 can for example be a layer of silicon oxide or silicon nitride or silicon oxycarbide (SiCO) of a few nanometers thick, deposited for example by atomic layer deposition (ALD).

Figure 2D:
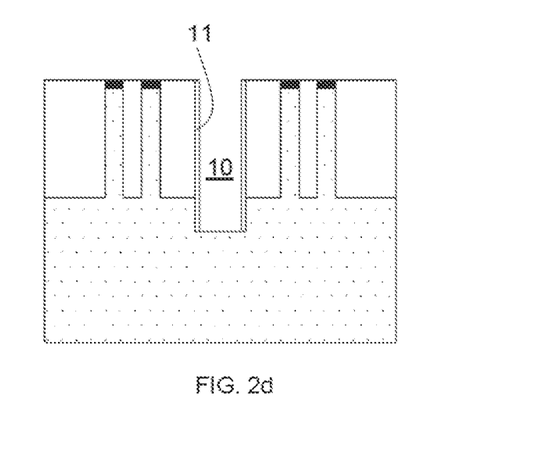

As shown in FIG. 2d, the liner 11 is then removed from the bottom of the trench 10 and from the upper surface of the device wafer, while maintaining the liner on the sidewalls of the trench 10. As known in the art, this can be done by a plasma etch process as described for example in document EP3035369A1.

Figure 2E:
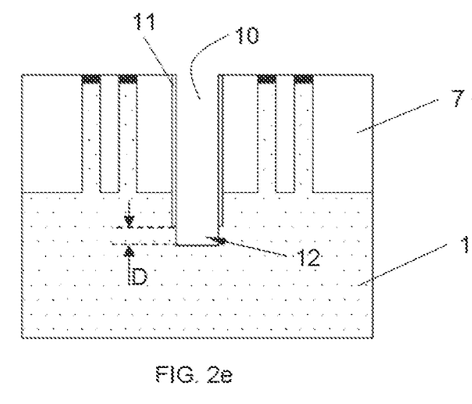

Next, referring to FIG. 2e, in accordance with at least some embodiments, the trench 10 is then further deepened, while maintaining the liner 11 on the sidewalls. This can be done by an etch recipe that removes Si anisotropically with respect to the liner material. An extension 12 of the trench is thereby created having a depth D. As an example, the depth can be in the order of 20-30 nm with no liner present on the sidewalls of the extension 12. The depth of the extension 12 is however not limited to any specific value, and can depend on the selectivity of the etch process subsequently applied (examples of which are described below). In accordance with at least some other embodiments, the trench 10 is not further deepened such that the extension 12 is not formed.

After this, another etch process is applied that removes Si starting from the inside of the extension 12 or from the bottom of the trench 10 when no extension 12 is formed. The removal is not aligned to the sidewalls of the trench 10, but proceeds downward and laterally outward from the bottom of the trench 10 (e.g., the bottom of the trench before forming the extension 12). This etch process is selective with respect to the liner material, e.g., the Si is etched at a considerably faster rate than the liner 11.

Figure 2F:
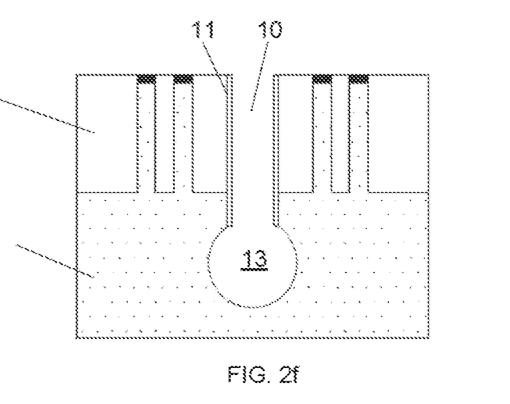

Next, FIG. 2f illustrates the result of an isotropic etch process (e.g., a process that proceeds in three dimensions) that removes the Si of the bulk portion so that a cavity 13 is formed having an essentially spherical or circular cross-section as seen in a plane perpendicular to the longitudinal direction of the trench. The fact that the etch process is selective with respect to the liner material implicitly means that the cavity 13 is formed essentially below the liner 11 when the etch process is stopped, the term "below" being applicable when the device wafer is oriented horizontally with the front surface of the semiconductor layer facing upwards. FIG. 2f shows the theoretical case where the etch selectivity is 100% exclusive (e.g., the liner is not etched) and where the spherical shape of the cavity 13 is obtained when the upper rim of the cavity 13 coincides with the lower rim of the liner 11. In reality, the etch selectivity may not be 100% exclusive and the desired spherical shape may not be reached until the etch process progresses a little further than the outer rim of the liner 11, depending on the etch rate that is applicable using a given etch chemistry.

Figure 3:
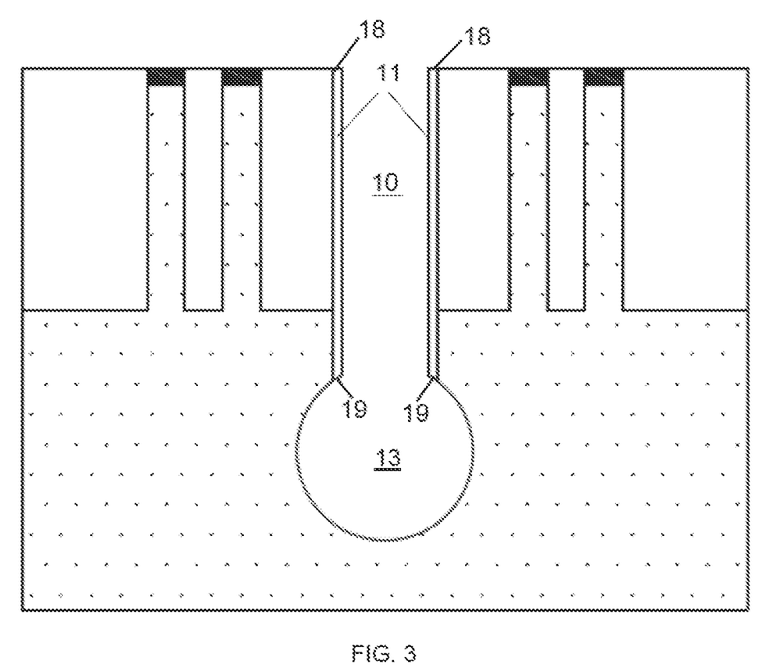
FIG. 3 and FIG. 4 illustrate different possible end results of an isotropic etch process used for creating a spherical cavity in a silicon (Si) layer of a device wafer in accordance with the example embodiments.
Figure 4:
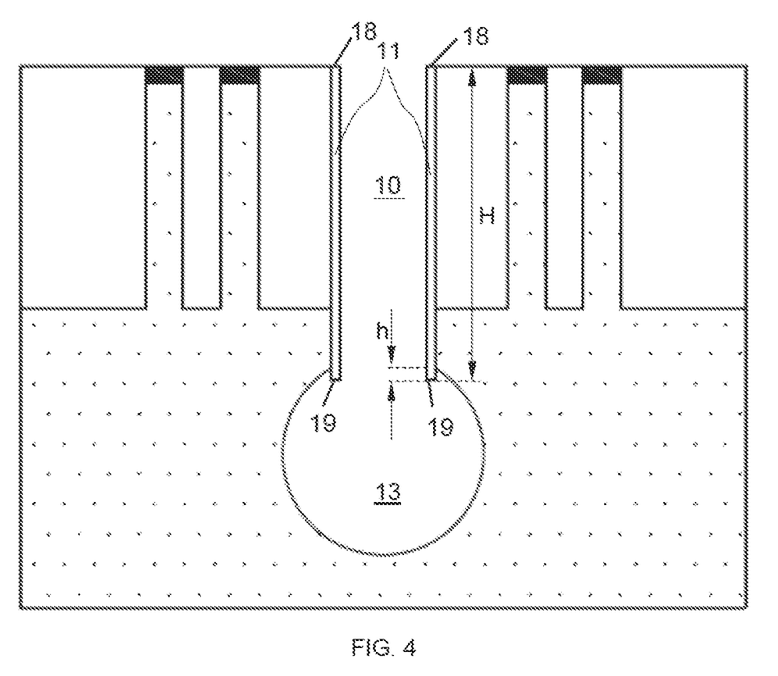

Next, FIG. 3 and FIG. 4 show alternative end results obtainable when the etch process is stopped in accordance with the example embodiments. In FIG. 3, the inner rim of the liner 11 (having an upper edge 18 and a lower edge 19) is truncated by the etch process while the thickness of the liner 11 remains virtually intact or slightly reduced. In the case of FIG. 3 therefore, the cavity 13 is also formed below the liner 11.

In FIG. 4, the spherical shape of the cavity 13 is not reached until the etch process progresses beyond the lower edge 19 of the liner 11 along a height h. As long as the height h is small compared to the original height H of the liner, for example smaller than 10% of this original height, or smaller than 5% or 3% or 2%, this embodiment is still defined as a cavity that is "below the liner", or equivalently, "a cavity that extends downward and laterally outward from the bottom (prior to the extension formation) of the trench." The trench 10 is shown in FIG. 3 and FIG. 4.

Figure 2G:
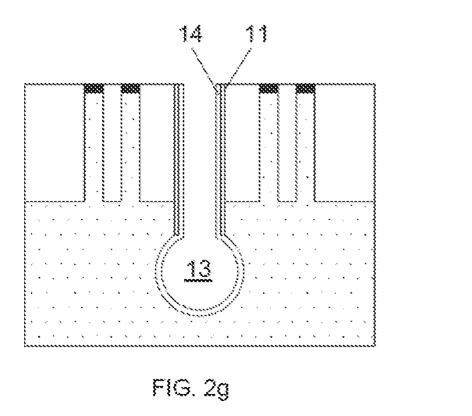

Turning back to FIG. 2g, a second liner 14 can be formed on the inner surface of the trench 10 (e.g., on the first liner 11) and on the inner surface of the cavity 13. The second liner 14 can be formed of the same material as the first liner 11 and can for example be formed by atomic layer deposition (ALD) or by area selective deposition (ASD). The second liner 14 is equally formed on the upper surface of the device wafer, but subsequently removed therefrom by a planarization process (including CMP for example). The second liner 14 can be used when the eventual buried rail needs to be isolated from the bulk of the Si layer 1. This can depend on the dopant type of the fins and/or on the type and functionality of the active devices that are to be connected to the buried rail.

Figure 2H:
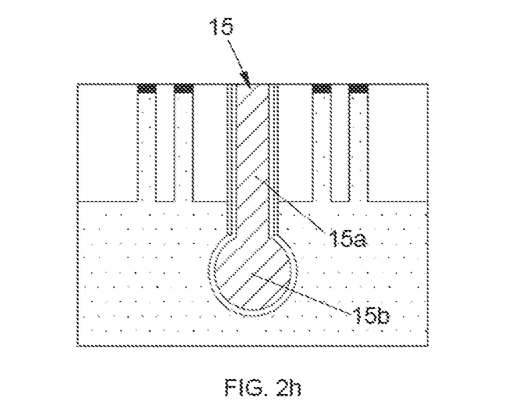

With reference to FIG. 2h, the trench 10 and the cavity 13 are then filled with an electrically conductive material, such as a metal that can be applied by any suitable technique known in the art, to thereby form the buried power rail 15, consisting of a narrow portion 15a and a wider portion 15b (e.g., wider than the narrow portion 15a) extending downward from the lower end of the narrow portion 15a. Throughout this description and in the appended claims, the terms "narrow", "wide", "wider" and "width" refer to dimensions extending in the direction perpendicular to the longitudinal direction of the trench 10.

The deposition of metal can be preceded by the deposition of a barrier layer and a seed layer (not shown), also well known in the art. Metal deposition can, for example, be done by plating or by ALD, or by physical vapor deposition and reflow cycling, a technique that is also known as such in the art. ALD is however likely to leave a void in the center of the cavity 13 due to the nature of the deposition process. This will not form a problem for the functionality of the buried rails 15, as will be explained further. In any case, a volume of conductive material is deposited in the cavity 13 and forms an integral part of the buried rail 15, referred to in the appended claims as "wider portion" 15b configured to be contacted from the back of the Si layer 1 during subsequent processing. The lateral dimension of the wider portion 15b is significantly larger than the width of the rail, enabling a large contact area with a TSV connection formed from the back side of the Si layer 1, as will be described hereafter.

According to one or more alternative embodiments, the first liner 11 is removed from the sidewalls of the trench 10 before depositing the second liner 14 or before filling the trench (if no second liner is used). The removal of the liner 11 from the sidewalls can be done by a wet etch process or by a dry isotropic etch process. The removal of the first liner allows more space for the filling of the trenches and can thereby contribute to downscaling the dimensions of active devices on the IC.

After removing any conductive material deposited on the upper surface of the device wafer (for example, by planarization), processing of active devices on the device wafer can start. This involves a large number of functions for producing mainly transistors on the fins 2 and 2', to thereby produce the so-called front end of line (FEOL) portion of the IC. Such functions are known to persons having ordinary skill in the art.

Figure 2I:
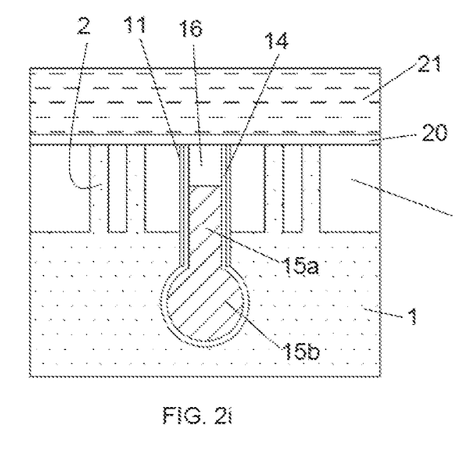

Next, FIG. 2i shows that the narrow part 15a of the buried rail is recessed from the top, and the obtained cavity is filled with a dielectric material 16. As known in the art, this is done to produce local interconnects to the active devices through this dielectric material 16.

The front end of line portion is schematically indicated in FIG. 2i by layer 20. On top of this layer is the back end of line (BEOL) portion 21, also well known in the art as a multilayer interconnect structure designed to connect the active devices of the front end of line to signal terminals of the chip. The buried power rails 15 (consisting of 15a and 15b) are connected to the active devices through local interconnects at specific positions along the fins. These interconnects are also not shown in FIG. 2i but their appearance and fabrication method can be in accordance with known technology.

Figure 2J:
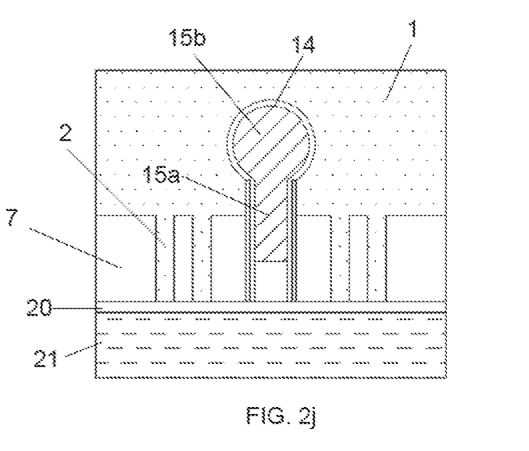

Reference is now made to FIG. 2j. After FEOL and BEOL processing, the device wafer is flipped 180° and bonded to a carrier wafer (not shown), after which the base wafer 5 is thinned. The thinning process can include grinding and CMP, and ends with an etch process that stops on the etch stop layer 6, followed by the removal of this etch stop layer, to thereby expose the back side surface of the Si layer 1, as illustrated in FIG. 2j. The above-described thinning and etching are also well-known in the art.

Figure 2K:
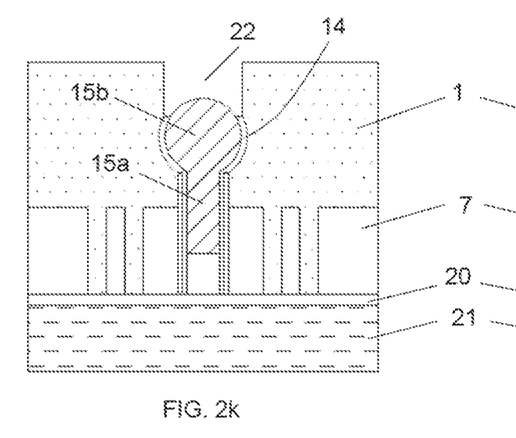

With reference to FIG. 2k, a via opening 22 is then produced by well-known lithography and etching techniques, aligned to the buried rail 15. The width of the via opening is larger than the width of the narrow rail portion 15a and fully overlaps this narrow rail portion. In the case shown, the width of the via opening 22 is smaller than the width of the wider rail portion 15b, but the width of the via opening 22 can also exceed this wider rail portion's width. For embodiments including the second liner 14, FIG. 2k shows the second liner 14 can be removed from the bottom of the via opening 22.

Figure 2L:
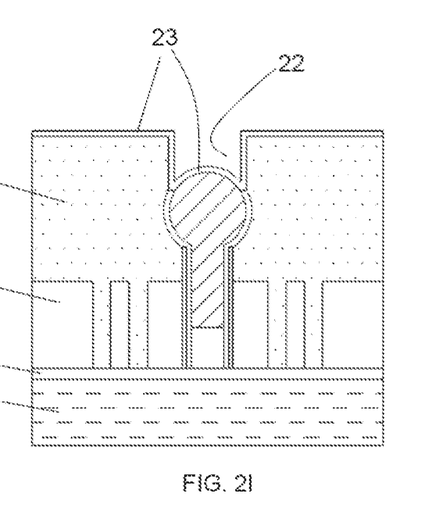
Figure 2M:
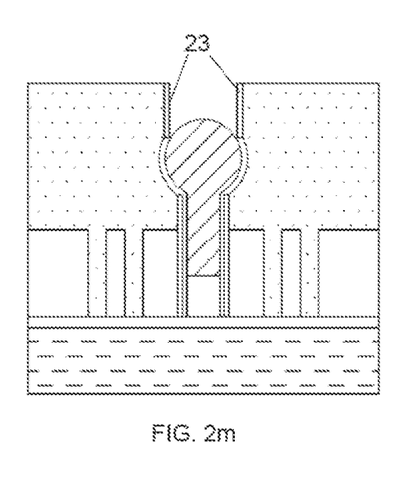

FIG. 2l and FIG. 2m illustrate that a third dielectric liner 23 is produced on the bottom and sidewalls of the via opening 22 and on the back side surface of the Si layer 1, followed by the removal of the third liner 23 from the bottom and upper surface while maintaining it on the sidewalls.

Figure 2N:
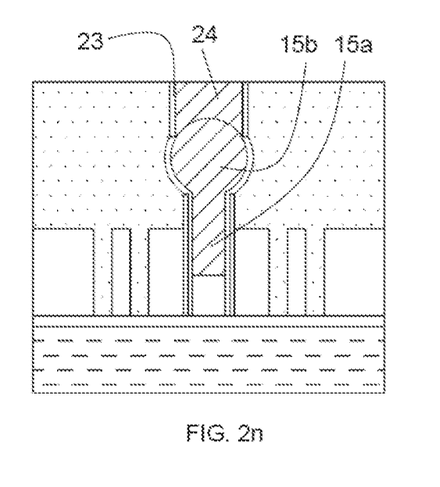

Then, with reference to FIG. 2n, an electrically conductive material, such as a metal, is deposited, filling the via opening 22, and creating thereby a TSV connection 24 from the back side of the Si layer 1 to the buried rail 15. The presence of the rail portion 15b having a larger width than the narrow rail portion 15a ensures a large contact area between the TSV connection 24 and the rail 15.

Following this, further well-known functions can be applied for producing a power delivery network on the back side of the Si layer 1, configured to deliver power to the active devices in the FEOL portion 20 on the front side of the Si layer 1.

Figure 5A:
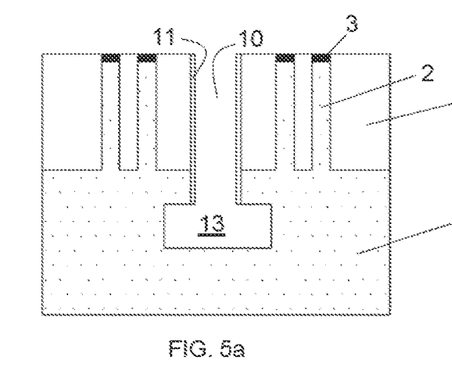
FIG. 5*a* and FIG. 5*b* show an alternative shape of a cavity by using a different etch process in accordance with the example embodiments.
Figure 5B:
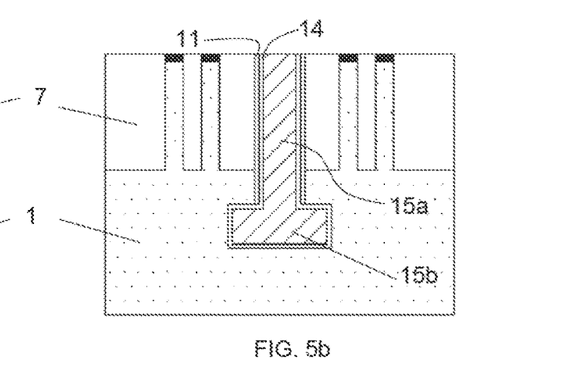

FIG. 5a and FIG. 5b illustrate another embodiment, wherein the cavity 13 is produced by a process known as "atomic layer etching" (ALE), starting from the extension 12 of the trench 10, shown in FIG. 2e. ALE enlarges the extension 12 not in an isotropic way, but by progressively shifting the sidewalls of the extension 12, until a cavity is obtained having an essentially rectangular cross section along two orthogonal vertical planes. As shown in FIG. 5b, the deposition of the second liner 14 and of the conductive material takes place in the same way as described above, leading to the buried rail comprising a narrow portion 15a and a larger portion 15b. The other functions described above for producing the TSV connection 24 are applicable as such to this embodiment.

The cavity 13 can have other shapes besides the spherical and rectangular shapes described above. One alternative can be a diamond-shape, obtainable when an isotropic etch process is applied that progresses according to specifically oriented crystal planes of the semiconductor layer 1.

In the embodiment described so far, the wider portion 15b of the buried rail extends along the entire length of the rail, e.g., in the direction perpendicular to the drawings. It is also possible to produce the wider portion 15b locally, e.g., only at the location along the length of the rail where the TSV connection is to be located. Further aspects of this embodiment are illustrated in FIG. 6a and FIG. 6b to FIG. 12a and FIG. 12b. Each pair of images labelled "a" and "b" shows respective cuts along two orthogonal planes.

Figures 6A, 6B:
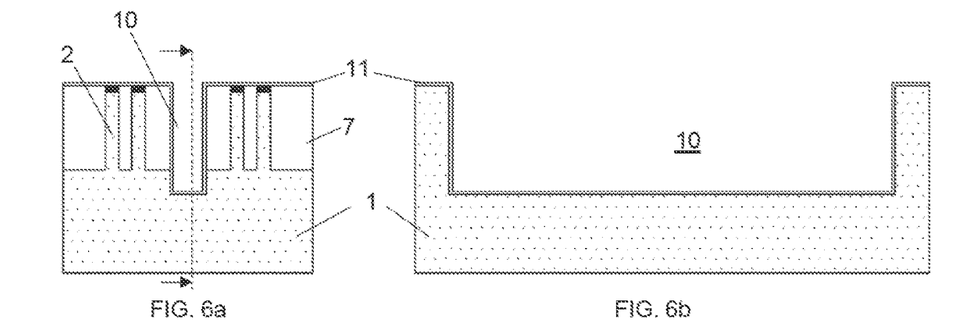
FIG. 6*a*, FIG. 6*b*, FIG. 7*a*, FIG. 7*b*, FIG. 8*a*, FIG. 8*b*, FIG. 9*a*, FIG. 9*b*, FIG. 10*a*, FIG. 10*b*, FIG. 11*a*, FIG. 11*b*, FIG. 12*a*, and FIG. 12*b* illustrate functions of example embodiments in which an isotropic etch process is applied locally and not along an entire length of a trench formed for producing a buried power rail.

In FIG. 6a and FIG. 6b, the trench 10 is shown, provided with the liner 11.

Figure 7A:
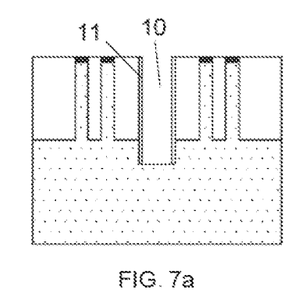
Figure 7B:
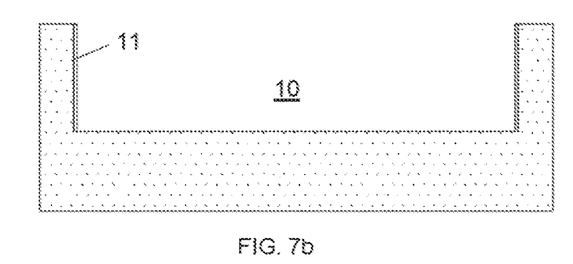

In FIG. 7a and FIG. 7b, the liner 11 has been removed from the bottom of the trench 10 and from the upper surface of the device wafer.

Figures 8A, 8B:
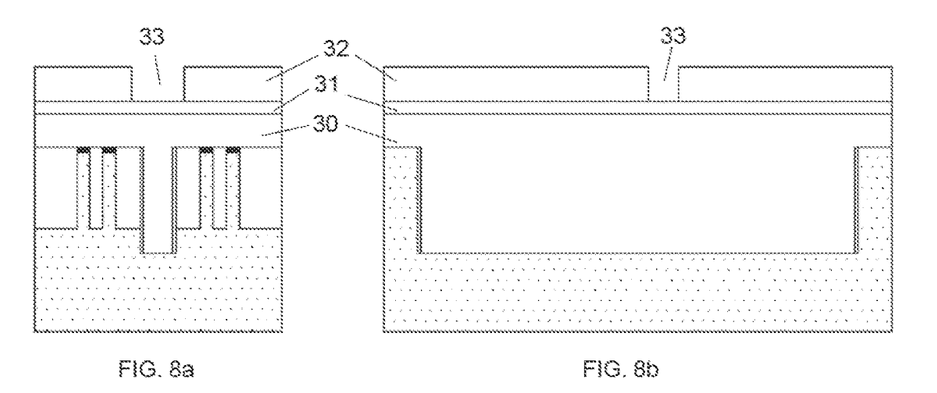
Figure 9A:
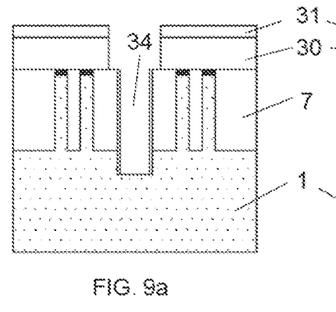
Figure 9B:
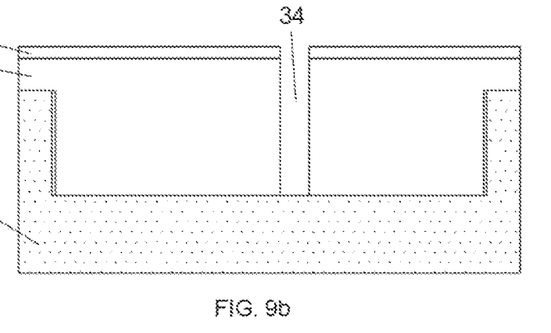

In FIG. 8a and FIG. 8b, a stack of an SOC (spin-on carbon) layer 30 and an SOG (spin-on glass) layer 31 has been deposited on the device wafer, followed by the deposition and patterning of a resist layer 32. The use of and SOC/SOG stack as a hardmask is well known in the art of lithography and etching techniques. The patterned resist layer 32 exhibits an opening 33 above and overlapping the trench 10, the opening being wider than the trench 10. This is followed by etching the SOC/SOG stack 30/31 anisotropically relative to the resist layer 32, as illustrated in FIG. 9a and FIG. 9b, to thereby create an opening 34 in the SOC/SOG stack, e.g., the SOC/SOG stack 30/31 is turned into a mask that enables locally processing the portion of the Si layer 1 exposed by the opening 34. The etch process is selective with respect to the Si of layer 1 and to the liner 11, so that in the direction perpendicular to the trench, the opening 34 is self-aligned to the liner 11 on the sidewalls of the trench. In the longitudinal direction of the trench, the opening 34 has the same width as the opening 33 in the resist layer 32. The resist layer 32 is consumed during this process or any remaining resist is stripped after forming the opening 34.

Figure 10A:
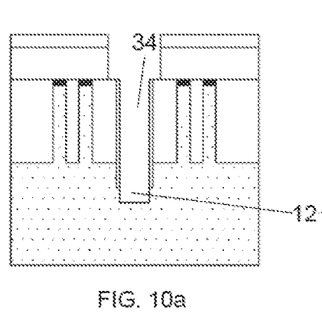
Figure 10B:
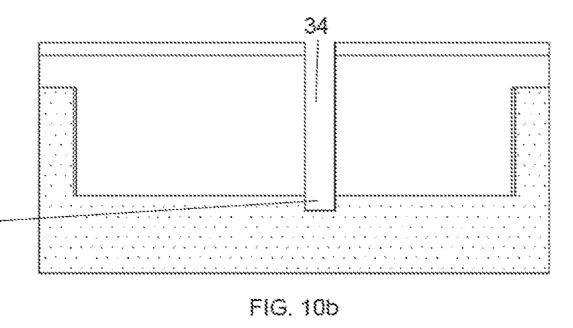
Figure 11A:
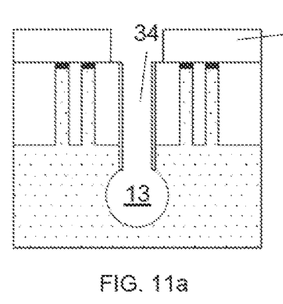
Figure 11B:
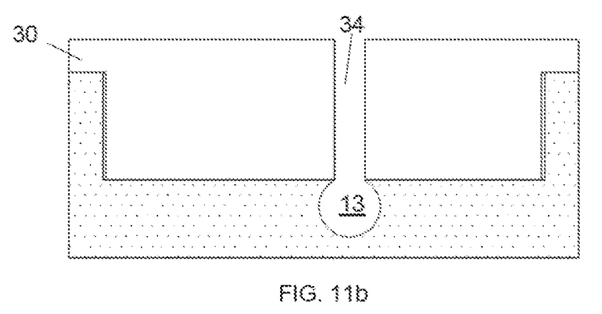
Figure 12A:
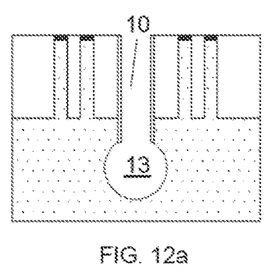
Figure 12B:
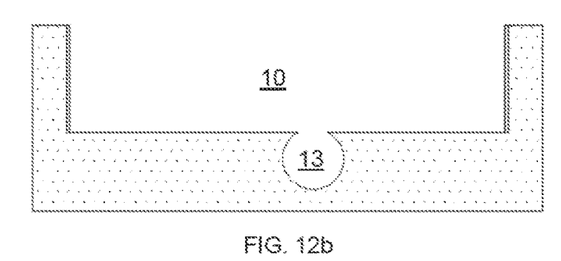

As shown in FIG. 10a and FIG. 10b, the opening 34 is then deepened anisotropically to form a local downward extension 12 of the trench 10, followed by an isotropic etch that now creates a locally formed spherical cavity 13 extending outward in three dimensions from the part of the bottom of the trench corresponding to the opening 34 (FIG. 11a and FIG. 11b). The isotropic etch is selective with respect to the liner 11 and with respect to the SOC material of the mask so that the cavity is formed essentially below the liner and below the SOC layer 30. This is followed by the removal of the SOG layer. The removal of the SOG layer can also take place at another point of the process, for example before the deepening or simultaneously with the isotropic etch process. This can depend on the etch chemistry that is being used. The cavity 13 can alternatively be a rectangular shaped cavity if the ALE process is applied. Finally, the SOC layer 30 is removed resulting in the images shown in FIG. 12a and FIG. 12b. After this, the method can include functions as described above with reference to FIG. 2g to FIG. 2n.

In an alternative embodiment, removing the liner 11 (as shown in FIG. 7a and FIG. 7b) is skipped, and the liner 11 is removed locally from the bottom the opening 34, prior to deepening the opening. According to further alternatives, a plurality of cavities 13 can be formed at various locations along the length of the trench 10. According to still further alternatives, deepening the opening 34 and forming the extension 12 can be omitted.

Figure 13A:
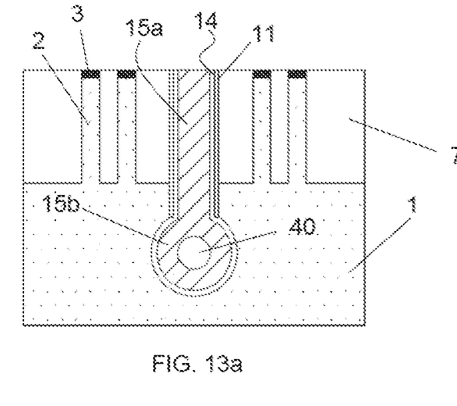
FIG. 13*a*, FIG. 13*b*, FIG. 13*c*, FIG. 13*d*, and FIG. 13*e* illustrate aspects of example embodiments applicable to forming a void at the center of the conductive material that fills a cavity.
Figure 13B:
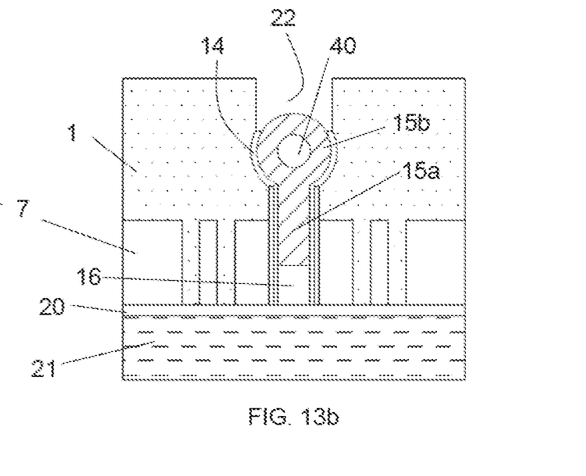
Figure 13C:
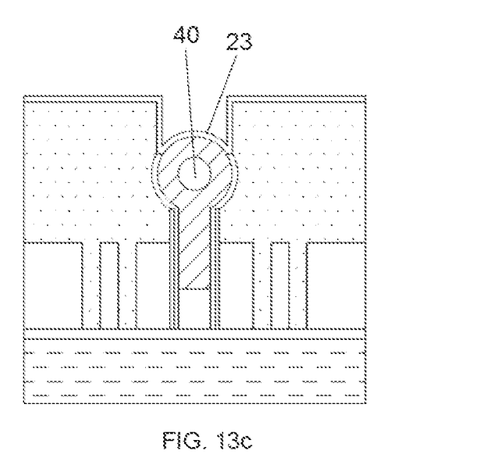

FIG. 13a illustrates the appearance of a void 40 in the center of the cavity 13 when the ALD process (atomic layer deposition) is used to fill the cavity with an electrically conductive material. The method continues as described above for the case of a fully solid volume 15b at the bottom of the trench, starting with the creation of a via opening 22 from the back side of the Si layer, illustrated in FIG. 13b, and the formation of the third liner 23, shown in FIG. 13c. These functions can then be further pursued, leaving the void in place.

Figure 13D:
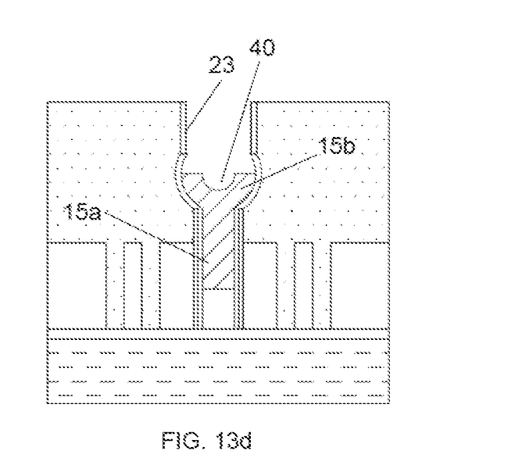
Figure 13E:
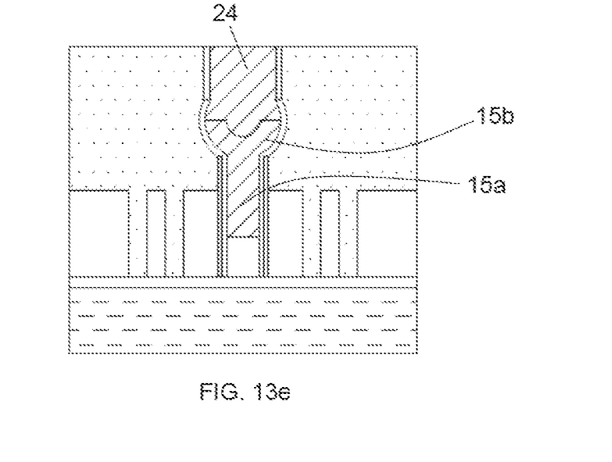

However according to another embodiment, the contact area can be further increased by first removing the third liner 23 from the bottom of the via opening 22 and then partially removing the material of the volume 15b, until the void 40 is exposed, as illustrated in FIG. 13d. The void 40 can be exposed about half-way as shown in the drawing, but this can also be a little more or less. The via opening 22 is then filled with conductive material, leading to the result shown in FIG. 13e, wherein the surface of the half-void contributes to increasing the contact surface area between the wider rail portion 15b and the TSV 24.

III. Example Operation

Figure 14:
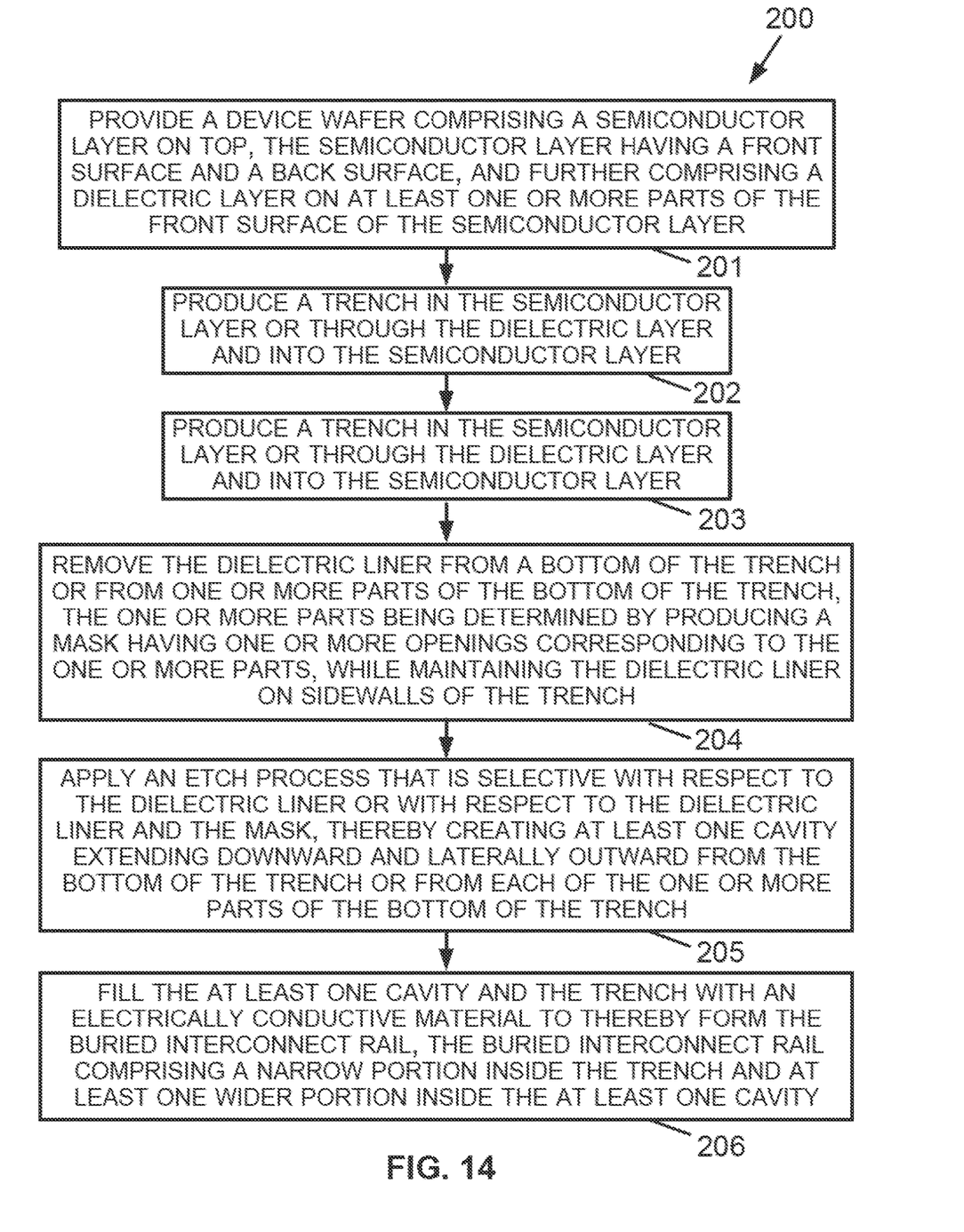
FIG. 14 is a flowchart showing functions of methods in accordance with the example embodiments.

Next, FIG. 14 is a flowchart showing a set 200 of functions of methods in accordance with the example embodiments. The functions of the set 200 are shown in a block 201 to block 206. A method using one or more functions of the set 200 can include a method for producing a buried interconnect rail of an integrated circuit chip.

Block 201 includes providing a device wafer comprising a semiconductor layer on top. The semiconductor layer has a front surface and a back surface. The device wafer also comprises a dielectric layer on at least one or more parts of the front surface of the semiconductor layer.

Next, block 202 incudes producing a trench in the semiconductor layer or through the dielectric layer and into the semiconductor layer.

Next, block 203 includes producing a dielectric liner on inner surfaces of the trench.

Next, block 204 includes removing the dielectric liner from a bottom of the trench or from one or more parts of the bottom of the trench. The one or more parts are determined by producing a mask having one or more openings corresponding to the one or more parts, while maintaining the dielectric liner on sidewalls of the trench.

Next, block 205 includes applying an etch process that is selective with respect to the dielectric liner or with respect to the dielectric liner and the mask, thereby creating at least one cavity extending downward and laterally outward from the bottom of the trench or from each of the one or more parts of the bottom of the trench.

Next, block 206 includes filling the at least one cavity and the trench with an electrically conductive material to thereby form the buried interconnect rail. The buried interconnect rail comprises a narrow portion inside the trench and at least one wider portion inside the at least one cavity.

In at least some embodiments of a method that includes performing one or more functions of the set 200, the method also includes deepening the bottom of the trench or the one or more parts of the bottom of the trench while maintaining the dielectric liner on the sidewalls of the trench, thereby creating one or more extensions of the trench. In accordance with these embodiments, no liner is present on the sidewalls of the one or more extensions. Additionally, the etch process for creating the at least one cavity is applied after creating the one or more extensions.

In at least some embodiments of a method that includes performing one or more functions of the set 200, the etch process is an isotropic etch process. Moreover, the at least one cavity has a spherical shape or a diamond shape, as seen in a cross section oriented perpendicularly with respect to a longitudinal direction of the trench.

In at least some embodiments of a method that includes performing one or more functions of the set 200, the etch process is an atomic layer etch process. Moreover, the at least one cavity has a rectangular shape, as seen in a cross section oriented perpendicularly with respect to a longitudinal direction of the trench.

In at least some embodiments of a method that includes performing one or more functions of the set 200, the method also includes thinning the device wafer until the back surface of the semiconductor layer is exposed and producing a via opening through the back surface. The via opening is wider than the narrow portion of the buried rail and fully overlaps the narrow portion so that the via opening also overlaps at least part of the wider portion of the buried rail. The method also includes filling the via opening with an electrically conductive material, thereby forming a TSV connection that contacts one of the at least one wider portions of the buried rail.

In at least some embodiments of a method discussed in the preceding paragraph, filling the trench and the at least one cavity results in the appearance of a void in a center of the at least one wider portion of the rail. After forming the via opening, the wider portion of the rail is partially removed until a part of an inner surface of the void is exposed. Moreover, the TSV connection is formed by filling the part of the inner surface of the void and by filling the via opening with the conductive material.

In at least some embodiments of a method discussed above that include performing one or more functions of the set 200, the dielectric liner include a first dielectric liner. Additionally, a second dielectric liner is deposited on the first dielectric liner and on an inner surface of the at least one cavity, before filling the cavity and the trench with the electrically conductive material.

In at least some embodiments of a method that include performing one or more functions of the set 200, the dielectric liner is removed from the sidewalls of the trench, before filling the trench and the cavity.

In at least some embodiments of a method discussed in the preceding paragraph, a second dielectric liner is deposited on the sidewalls of the trench and on an inner surface of the at least one cavity, before filling the cavity and the trench with the electrically conductive material.

IV. Conclusion

This description relates to a microstructure obtainable by the methods described above. A microstructure (or semiconductor microstructure) is defined in the present context as a structure comprising (semiconductor) components whose dimensions are on the scale of nanometers or tens of nanometers, such as the fins and the buried rails described above. This description also relates to an integrated circuit chip comprising such a microstructure.

While example embodiments are illustrated and described in detail in the drawings and foregoing description, such illustration and description are to be considered illustrative or exemplary and not restrictive. Other variations to the disclosed embodiments can be understood and effected by those skilled in the art, from a study of the drawings, the disclosure and the appended claims. In the claims, the word "comprising" does not exclude other functions, elements or steps, and the indefinite article "a" or "an" does not exclude a plurality. The mere fact that certain measures are recited in mutually different dependent claims does not indicate that a combination of these measures cannot be used in other embodiments. Any reference signs in the claims should not be construed as limiting the scope.

The foregoing description details certain example embodiments. It will be appreciated, however, that no matter how detailed the foregoing appears in text, the example embodiments can be practiced in many ways, and is therefore not limited to the embodiments disclosed. It should be noted that the use of particular terminology when describing certain features or aspects of the example embodiments should not be taken to imply that the terminology is being re-defined herein to be restricted to include any specific characteristics of the features or aspects of the embodiments with which that terminology is associated.

Unless specifically specified, the description of a layer being present, deposited or produced "on" another layer or substrate, includes the options of the layer being present, produced or deposited directly on, e.g., in physical contact with, the other layer or substrate, and the layer being present, produced or deposited on one or a stack of intermediate layers between the layer and the other layer or substrate.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for producing a buried interconnect rail of an integrated circuit chip, the method comprising:
   providing a device wafer comprising a semiconductor layer on top, the semiconductor layer having a front surface and a back surface, and further comprising a dielectric layer on at least one or more parts of the front surface of the semiconductor layer;

producing a trench in the semiconductor layer or through the dielectric layer and into the semiconductor layer;

producing a dielectric liner on inner surfaces of the trench;

removing the dielectric liner from a bottom of the trench or from one or more parts of the bottom of the trench, the one or more parts of the bottom of the trench being determined by producing a mask having one or more openings corresponding to the one or more parts of the bottom of the trench, while maintaining the dielectric liner on sidewalls of the trench;

applying an etch process that is selective with respect to the dielectric liner or with respect to the dielectric liner and the mask, thereby creating at least one cavity extending downward and laterally outward from the bottom of the trench or from each of the one or more parts of the bottom of the trench;

filling the at least one cavity and the trench with an electrically conductive material to thereby form the buried interconnect rail, wherein the buried interconnect rail comprises a narrow portion inside the trench and at least one wider portion inside the at least one cavity, and filling the at least one cavity and the trench results in a void in a center of the at least one wider portion of the buried interconnect rail;

thinning the device wafer until the back surface of the semiconductor layer is exposed;

producing a via opening through the back surface, the via opening being wider than the narrow portion of the buried interconnect rail and fully overlapping the narrow portion so that the via opening also overlaps at least part of the wider portion of the buried interconnect rail, after producing the via opening, removing a portion of the wider portion of the buried interconnect rail until an inner surface of a portion of the void is exposed; and filling the portion of the void and the via opening with an electrically conductive material to form a through-silicon via (TSV) connection that contacts one of the at least one wider portion of the buried interconnect rail.

2. The method according to claim 1, wherein:
the etch process is an isotropic etch process, and
the at least one cavity has a spherical shape or a diamond shape, as seen in a cross section oriented perpendicularly with respect to a longitudinal direction of the trench.

3. The method according to claim 1, wherein:
the etch process is an atomic layer etch process, and
the at least one cavity has a rectangular shape, as seen in a cross section oriented perpendicularly with respect to a longitudinal direction of the trench.

4. The method according to claim 1, further comprising:
deepening the bottom of the trench or the one or more parts of the bottom of the trench while maintaining the dielectric liner on the sidewalls of the trench, thereby creating one or more extensions of the trench, wherein:
no liner is present on the sidewalls of the one or more extensions, and
the etch process for creating the at least one cavity is applied after creating the one or more extensions.

5. The method according to claim 4, wherein:
the etch process is an isotropic etch process, and
the at least one cavity has a spherical shape or a diamond shape, as seen in a cross section oriented perpendicularly with respect to a longitudinal direction of the trench.

6. The method according to claim 4, wherein:
the etch process is an atomic layer etch process, and
the at least one cavity has a rectangular shape, as seen in a cross section oriented perpendicularly with respect to a longitudinal direction of the trench.

7. The method according to claim 1, wherein:
the dielectric liner includes a first dielectric liner, and
a second dielectric liner is deposited on the first dielectric liner and on an inner surface of the at least one cavity, before filling the at least one cavity and the trench with the electrically conductive material.

8. The method according to claim 1, wherein the dielectric liner is removed from the sidewalls of the trench before filling the at least one cavity and the trench.

9. The method according to claim 8, wherein a second dielectric liner is deposited on the sidewalls of the trench and on an inner surface of the at least one cavity, before filling the at least one cavity and the trench with the electrically conductive material.

10. The method according to claim 1, wherein the buried interconnect rail is arranged as a buried power rail.

11. The method according to claim 1, wherein the electrically conductive material that fills the at least one cavity and the trench and the electrically conductive material that fills the portion of the void and the via opening are a metal.

12. The method according to claim 1, wherein filling the at least one cavity and the trench with an electrically conductive material is provided by atomic layer deposition.

13. The method according to claim 1, wherein filling the at least one cavity and the trench with an electrically conductive material is provided by plating, or by physical vapor deposition and reflow cycling.

14. The method according to claim 1, wherein the producing the mask occurs by forming a stack of spin-on-carbon and spin-on-glass.

15. The method according to claim 1, wherein the dielectric liner includes a layer of silicon oxide, silicon nitride, or silicon oxycarbide.

16. The method according to claim 1, wherein the integrated circuit chip comprises a complementary metal oxide semiconductor layout of fin field-effect transistors.

17. The method according to claim 1, wherein the at least one wider portion of the buried interconnect rail extends along an entire length of the buried interconnect rail.

18. The method according to claim 1, wherein the at least one wider portion of the buried interconnect rail are produced locally at one or more locations where the TSV connection is located.

19. The method according to claim 1, wherein the at least one cavity includes a plurality of cavities formed at various locations along the trench.

20. The method according to claim 1, wherein removing the dielectric liner occurs by a wet etch process or a dry isotropic etch process.

* * * * *